(12) United States Patent
Cheng et al.

(10) Patent No.: US 9,548,355 B1
(45) Date of Patent: Jan. 17, 2017

(54) COMPOUND FINFET DEVICE INCLUDING OXIDIZED III-V FIN ISOLATOR

(71) Applicant: International Business Machines Corporation, Armonk, NY (US)

(72) Inventors: Szu-Lin Cheng, Yorktown Heights, NY (US); Isaac Lauer, Yorktown Heights, NY (US); Kuen-Ting Shiu, Yorktown Heights, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/748,532

(22) Filed: Jun. 24, 2015

(51) Int. Cl.
| | | |
|---|---|---|
| *H01L 23/367* | (2006.01) | |
| *H01L 29/06* | (2006.01) | |
| *H01L 29/78* | (2006.01) | |
| *H01L 29/66* | (2006.01) | |
| *H01L 29/20* | (2006.01) | |

(52) U.S. Cl.
CPC ........ *H01L 29/0642* (2013.01); *H01L 29/20* (2013.01); *H01L 29/66795* (2013.01); *H01L 29/785* (2013.01)

(58) Field of Classification Search
CPC ......... H01L 29/06; H01L 29/16; H01L 29/20; H01L 29/40; H01L 29/66; H01L 29/423; H01L 29/00; H01L 29/78; H01L 29/04; H01L 29/10; H01L 29/66795; H01L 23/367; H01L 23/4006; H01L 23/467; H01L 2023/4031; H01L 2023/10852

USPC ........................................ 257/401, 308, 722
See application file for complete search history.

(56) References Cited

U.S. PATENT DOCUMENTS

| | | | |
|---|---|---|---|
| 6,472,695 B1 | 10/2002 | Hall et al. | |
| 6,531,414 B1 | 3/2003 | Johnson et al. | |
| 7,054,345 B2 | 5/2006 | Ryou et al. | |
| 7,932,160 B2 | 4/2011 | Almuneau et al. | |
| 2003/0173571 A1* | 9/2003 | Kish, Jr. ................ | B82Y 20/00 |
| | | | 257/85 |
| 2014/0264446 A1 | 9/2014 | Basu et al. | |
| 2014/0264592 A1* | 9/2014 | Oxland ............. | H01L 29/66795 |
| | | | 257/347 |

OTHER PUBLICATIONS

Czornomaz et al., "Co-integration of InGaAs n-and SiGe p-MOSFETs into digital CMOS circuits using hybrid dual-channel ETXOI substrates," International Electron Devices Meeting (IEDM), 2013, 2.8, 4 pages.

(Continued)

*Primary Examiner* — Chuong A Luu
(74) *Attorney, Agent, or Firm* — Cantor Colburn LLP; Vazken Alexanian

(57) ABSTRACT

A semiconductor device includes a wafer having a bulk layer and a III-V buffer layer on an upper surface of the bulk layer. The semiconductor device further includes at least one semiconductor fin on the III-V buffer layer. The semiconductor fin includes a III-V channel portion. Either the wafer or the semiconductor fin includes an oxidized III-V portion interposed between the III-V channel portion and the III-V buffer layer to prevent current leakage to the bulk layer.

5 Claims, 19 Drawing Sheets

(56) References Cited

OTHER PUBLICATIONS

Gebretsadik et al., "Lateral oxidation of InAlAs in InP-based heterostructures for long wavelength vertical cavity surface emitting laser applications," Applied Physics Letters, vol. 72, No. 2, 1998, pp. 135-137.
Gu, et al., "III-V gate-all-around nanowire MOSFET process technology: From 3D to 4D,." International Electron Devices Meeting (IEDM), 2012, 23.7, 4 pages.
Kim et al., "High performance sub-20-nm-channel-length extremely-thin body InAs-on-insulator Tri-gate MOSFETs with high short channel effect immunity and Vth tenability," International Electron Devices Meeting (IEDM), 2013, 16.4, 4 pages.
Cheng et al., "Compound FinFET Device Including Oxidized III-V Fin Isolator", U.S. Appl. No. 14/948,541, filed Nov. 23, 2015.
List of IBM Patents or Patent Applications Treated as Related; (Appendix P), Filed Jan. 28, 2016; 2 pages.

\* cited by examiner

COMPOUND FINFET DEVICE INCLUDING OXIDIZED III-V FIN ISOLATOR

BACKGROUND

The present invention relates to fin-type field effect transistor (finFET) semiconductor devices, and more specifically, to a III-V compound finFET semiconductor device.

The increasing operating speeds and computing power of microelectronic devices have recently given rise to the need for an increase in the complexity and functionality of the semiconductor structures from which these devices are fabricated. Integration of compound semiconductor materials such as, for example, III-V materials, such as gallium arsenide, gallium nitride, indium aluminum arsenide, and/or germanium with silicon or silicon-germanium substrate, to form compound semiconductor devices having improved material mobility, thereby increasing the overall functionality and performance of the semiconductor device.

In particular, heteroepitaxial growth is typically used to fabricate compound semiconductor devices where lattice-matched substrates are not commercially available. Performance and, ultimately, the utility of devices fabricated using a combination of dissimilar semiconductor materials, however, depends on the quality of the resulting structure. Namely, a low level of dislocation defects is important in a wide variety of semiconductor devices and processes, because dislocation defects partition an otherwise monolithic crystal structure and introduce unwanted and abrupt changes in electrical properties, which, in turn, results in poor material quality and limited performance. For example, threading dislocation segments can allow current to leak from the semiconductor channel, thereby degrading physical properties of the device material and reducing overall performance of the semiconductor device.

It has long been recognized that gallium arsenide grown on silicon substrates achieves increased electron mobility compared to pure silicon material. However, despite the widely recognized potential advantages of such combined structures and substantial efforts to develop them, their practical utility has been limited by high defect densities and increased thread dislocation when growing gallium arsenide layers on silicon substrates. To control thread dislocation, conventional compound semiconductor devices include a deep-well isolation region. The deep-well isolation region, however, only reduces the thread dislocation without completely eliminating thread dislocation in the compound semiconductor device. Consequently, current leakage from the semiconductor channel still exists.

SUMMARY

According to at least one embodiment of the present invention, a semiconductor device includes a wafer having a bulk layer and a III-V buffer layer on an upper surface of the bulk layer. The semiconductor device further includes at least one semiconductor fin on the III-V buffer layer. The semiconductor fin includes a III-V channel portion. Either the wafer or the semiconductor fin includes an oxidized III-V portion interposed between the III-V channel portion and the III-V buffer layer to prevent current leakage to the bulk layer.

According to another embodiment, a method fabricating a semiconductor device comprises forming a III-V semiconductor stack on an upper surface of a wafer. The III-V semiconductor stack includes an intermediate III-V layer interposed between an III-V channel layer and a III-V buffer layer formed on the wafer. The method further includes patterning the III-V channel layer to form at least one semiconductor fin on the intermediate III-V layer. The method further includes oxidizing the intermediate III-V layer to form a III-V oxidation layer that isolates the at least one semiconductor fin from the III-V buffer layer.

According to still another embodiment, a method of fabricating a semiconductor device comprises forming a III-V semiconductor stack on an upper surface of a wafer. The III-V semiconductor stack including an intermediate III-V layer interposed between an III-V channel layer and a III-V buffer layer formed on the wafer. The method further includes patterning the III-V channel layer to form at least one semiconductor fin including a buffer III-V portion interposed between an intermediate III-V portion and a remaining portion of the III-V buffer layer. The method further includes selectively oxidizing the intermediate III-V portion to isolate the at least one semiconductor fin from the III-V buffer layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings.

FIGS. 1-8 are a series of diagrams illustrating a process flow of fabricating a compound FinFET device including an oxidized III-V fin isolator according to a non-limiting embodiment, in which:

FIG. 1 illustrates a starting wafer including a bulk layer and a III-V semiconductor stack formed on an upper surface of the bulk layer according to a non-limiting embodiment;

FIG. 2 illustrates the wafer of FIG. 1 after patterning the III-V channel layer to form one or more semiconductor fins on the upper surface of the intermediate III-V layer;

FIG. 3 illustrates the wafer of FIG. 2 after forming optional fin spacers on opposing sidewalls of the semiconductor fins;

FIG. 4 illustrates the wafer of FIG. 3 following an oxidation process to form an oxidized III-V layer;

FIG. 5 illustrates the wafer of FIG. 4 following a local fin isolation process may be to isolate each fin from one another;

FIG. 6 illustrates the wafer of FIG. 5 following an etching process that exposes a portion of the spacers and an upper surface of the III-V channel portion;

FIG. 7 illustrates the wafer of FIG. 6 after performing a second selective etching process to pull down the fin spacers and expose an upper portion of the III-V channel portion; and FIG. 8 illustrates the wafer of FIG. 2 after performing the oxidation process to convert the intermediate III-V layer into an oxidized III-V layer according to another non-limiting embodiment.

FIGS. 9-14 are a series of diagrams illustrating a process flow of fabricating a compound FinFET device including an oxidized III-V fin isolator according to yet another non-limiting embodiment, in which:

FIG. 9 illustrates a starting wafer including a bulk layer and a III-V semiconductor stack formed on an upper surface of the bulk layer, where the III-V semiconductor stack includes a III-V interface layer interposed between the intermediate III-V layer and the III-V channel layer according to a non-limiting embodiment;

FIG. 10 illustrates the wafer of FIG. 9 after patterning the III-V channel layer to form one or more semiconductor fins on the upper surface of the intermediate III-V layer;

FIG. 11 illustrates the wafer of FIG. 10 following the formation of optional fin spacers on opposing sidewalls of the semiconductor fins;

FIG. 12 illustrates the wafer of FIG. 11 following an oxidation process to form an oxidized III-V layer;

FIG. 13 illustrates the wafer of FIG. 12 following a selective etching process such that a portion of the spacers and an upper surface of the III-V channel portion are exposed; and FIG. 14 illustrates the wafer of FIG. 13 following a second selective etching process to pull down the fin spacers and expose an upper portion of the III-V channel portion.

FIGS. 15-19 are a series of diagrams illustrating a process flow of fabricating a compound FinFET device including an oxidized III-V fin isolator according to still another non-limiting embodiment, in which:

FIG. 15 illustrates a starting wafer including a bulk layer and a III-V semiconductor stack formed on an upper surface of the bulk layer according to a non-limiting embodiment;

FIG. 16 illustrates the wafer of FIG. 15 after patterning the III-V channel layer to form one or more semiconductor fins including respective local intermediate III-V fin portions;

FIG. 17 illustrates the wafer of FIG. 16 following a second etching process that punches through the III-V buffer layer while the fin hardmasks preserve the fins;

FIG. 18 illustrates the wafer of FIG. 17 following an oxidation process to that converts the localized intermediate III-V portions of each fin into localized oxidized III-V fin portions; and FIG. 19 illustrates the wafer of FIG. 18 following a local fin isolation process to isolate each from one another.

DETAILED DESCRIPTION

Figure 1:
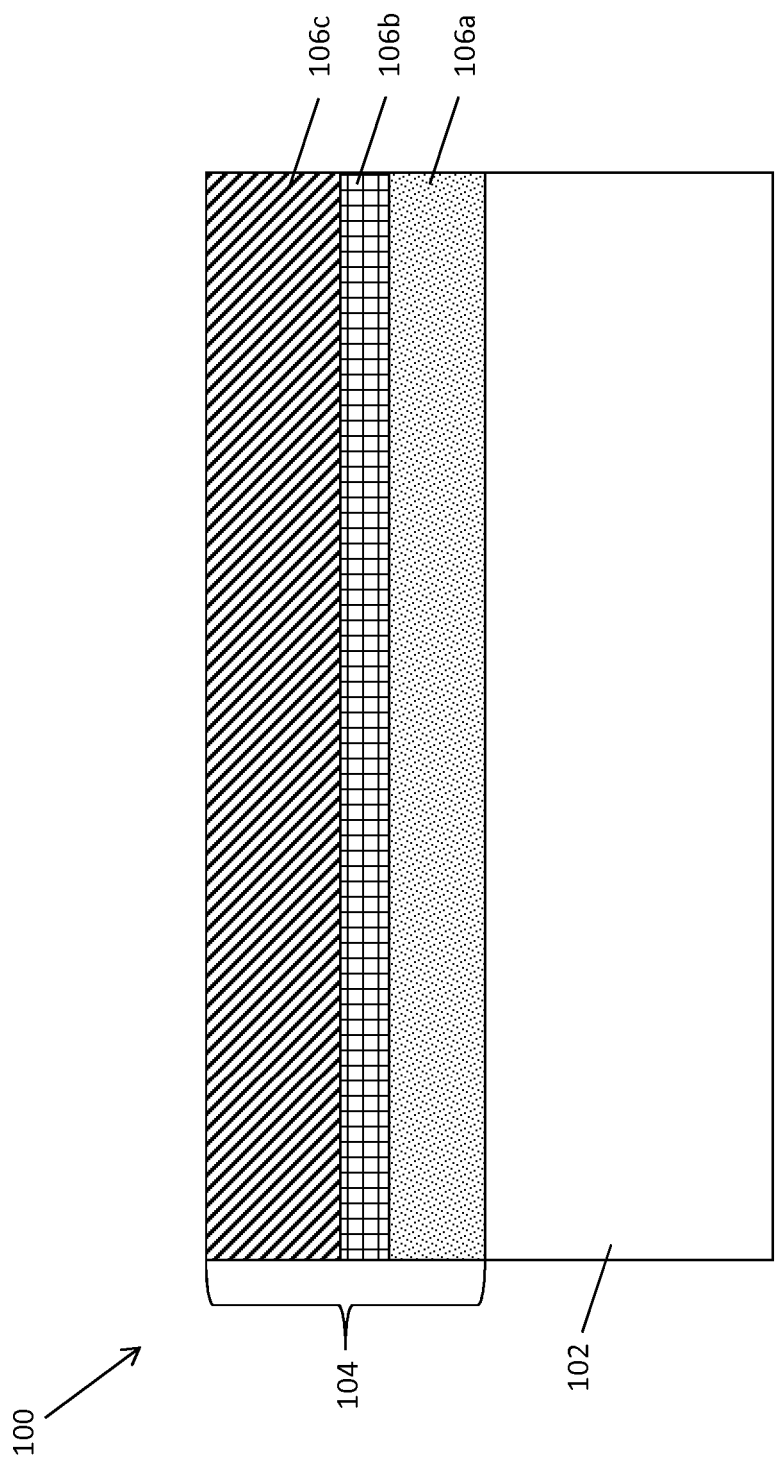

Various embodiments described herein provide a compound FinFET device including an oxidized III-V fin isolator to eliminate thread dislocation and prevent current leakage from the III-V channel of the fins. The III-V fin isolator may include an oxidized III-V portion interposed between a bulk layer of the wafer and one or more fins. According to another embodiment, the III-V fin isolator may include an oxidized III-V portion formed locally with each fin, and interposed between the III-V channel and the bulk layer of the wafer. In either case, the oxidized III-V layer can serve to prevent current leakage therethrough. Accordingly, the III-fin isolator can prevent any current flowing through the III-V channel portions from leaking into the bulk layer, thereby providing a compound FinFET device having improved performance.

With reference now to FIGS. 1-8, a series of diagrams illustrates a process flow of fabricating a compound FinFET device including an oxidized III-V fin isolator according to a non-limiting embodiment. Starting with FIG. 1, a starting wafer 100 is illustrated. The wafer 100 includes a bulk layer 102, such as a bulk silicon (Si) layer 102 for example, and a III-V semiconductor stack 104 formed on an upper surface of the bulk layer 102. The III-V semiconductor stack 104 includes a plurality of III-V layers 106a-106c. The plurality of III-V layers 106a-106c include a III-V buffer layer 106a formed on an upper surface of the bulk layer 102, an intermediate III-V layer 106b formed on an upper surface of the III-V buffer layer 106a, and a III-V channel layer 106C formed on an upper surface of the intermediate III-V layer 106b. In this manner, the intermediate III-V layer 106b is interposed between the III-V channel layer 106c and the III-V buffer layer 106a. An epitaxial growth process may be performed to form each III-V layer 106a-106c as understood by one of ordinary skill in the art. Although the stack 104 is illustrated as including three III-V layers 106a-106c, it should be appreciated that the number of III-V layers is not limited thereto.

According to a non-limiting embodiment, each III-V layer 106a-106c is formed from a different III-V material. For example, the III-V channel layer 106c is formed of indium gallium arsenide (InGaAs). The III-V channel layer 106c may contain an amount of indium (In) ranging from approximately 20% to approximately 80%, preferably 53%, for example. The intermediate III-V layer 106b may be formed of indium aluminum arsenide (InAlAs) and has a thickness ranging from approximately 5 nanometers (nm) to approximately 200 nm, preferably approximately 50 nm, for example. The III-V buffer layer 106a may also be formed of InGaAs, but with a different amount of indium (In). For example, the III-V buffer layer 106a may contain an amount of indium (In) ranging from 0% to approximately 53%, for example, while the III-V channel layer 106c contains 0% to approximately 53%, preferably approximately 53% of indium (In), for example.

Figure 2:
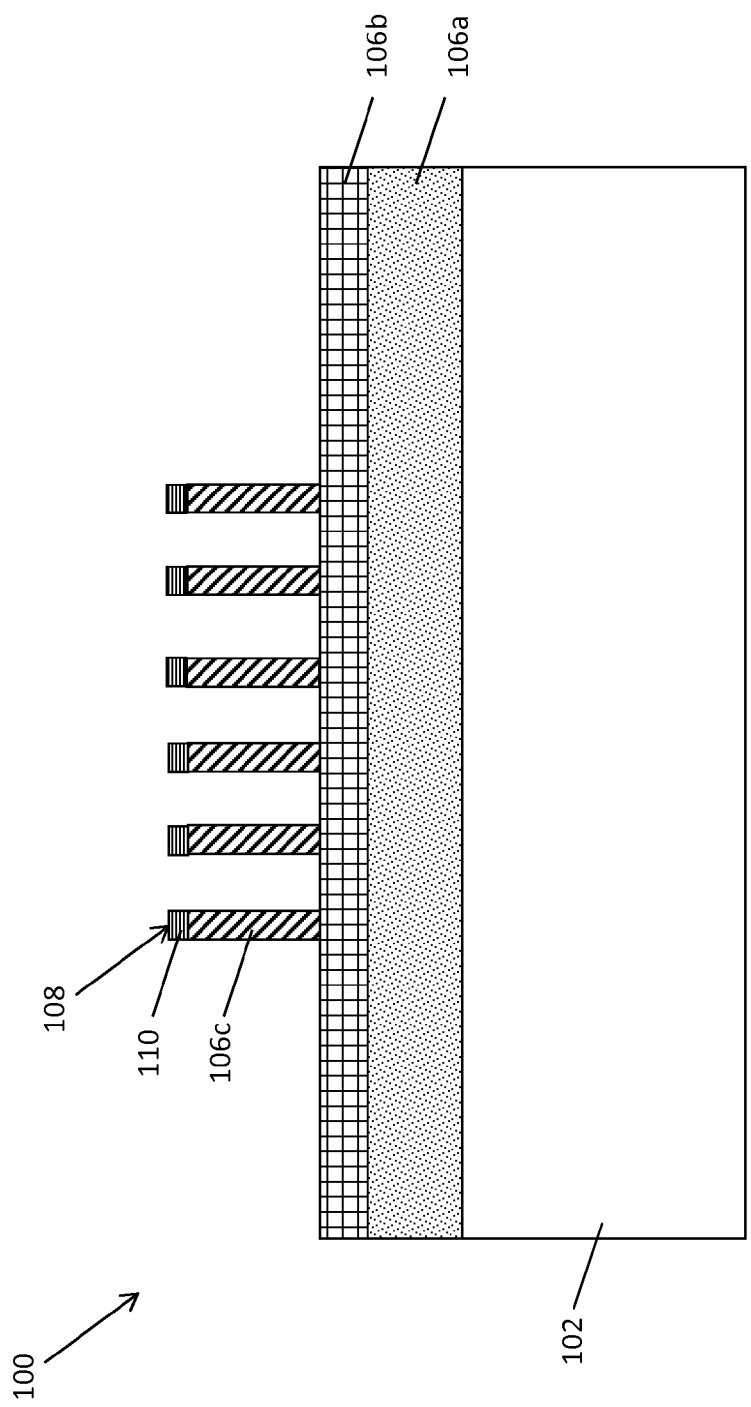

Referring to FIG. 2, the III-V channel layer 106c is patterned to form one or more semiconductor fins 108 on the upper surface of the intermediate III-V layer 106b. The fins 108 can be formed according to a well-known side image transfer (SIT) process, which utilizes a block hardmask layer (not shown) formed on an upper surface of the III-V channel layer 106c. The block hardmask layer is then patterned to designate the desired locations of the fins 108, and the pattern is transferred into the III-V channel layer 106c. The result is one or more semiconductor fins 108 formed on the intermediate III-V layer 106b. The fins 108 may further include a hardmask 110 that is left remaining following the fin patterning process as further illustrated in FIG. 2. According to a non-limiting embodiment, the fins 108 have a width ranging, for example, from approximately 1 nm to approximately 50 nm and a height ranging, for example, from approximately 5 nm to approximately 50 nm.

Figure 3:
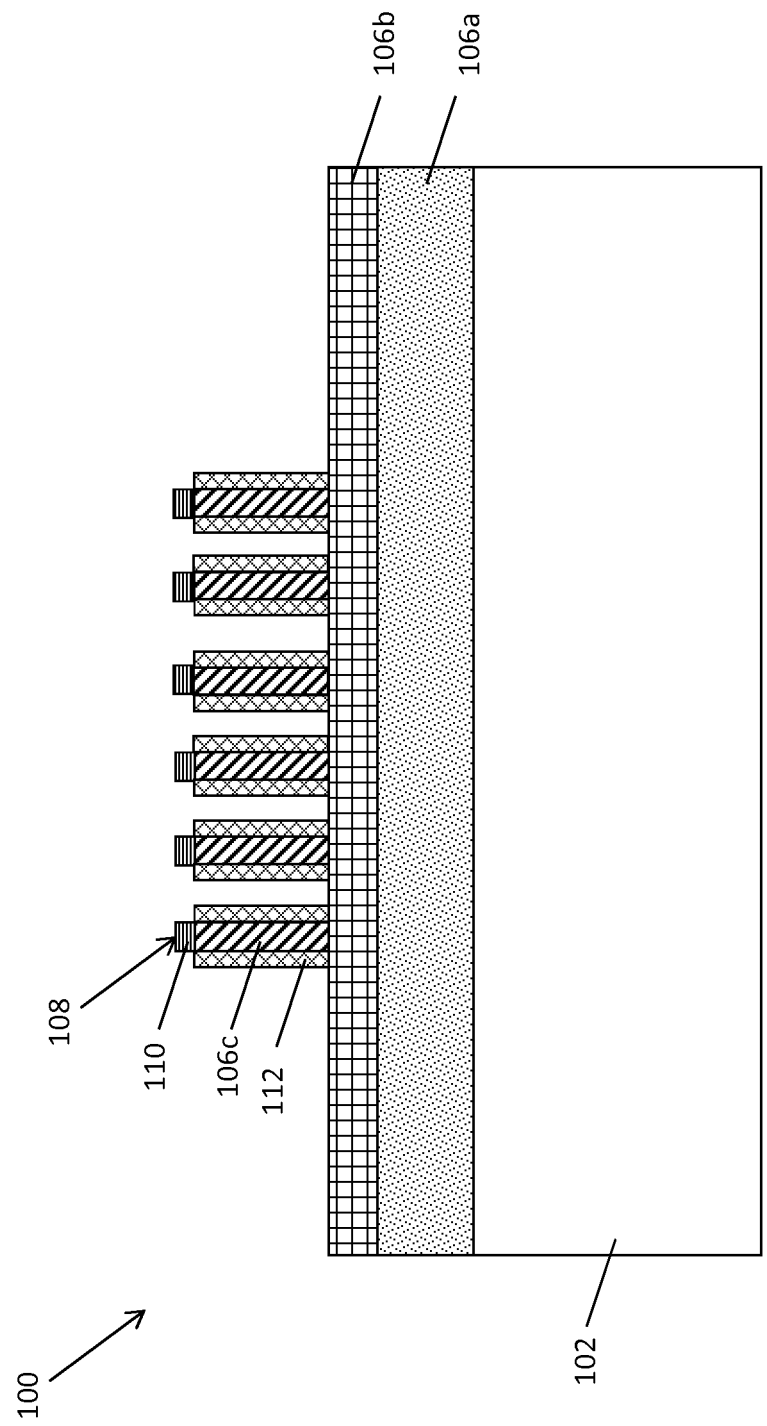

Referring now to FIG. 3, fin spacers 112 may optionally be formed on opposing sidewalls of the semiconductor fins 108. Various well-known etching processes may be used to form the fin spacers 112 on the III-V channel portion 106c on the fins 108. For example, a block nitride layer (not shown) may be deposited on an upper surface of the intermediate III-V layer 106b to cover the fins 108. Thereafter, a reactive ion etch (RIE) process selective to silicon dioxide (SiO2) and III-V material can be performed to form the fin spacers 112 on the sidewalls of the III-V channel portions 106c of the fins 108. The materials generally used for the hardmask and the spacers 112 include silicon dioxide and silicon nitride, for example. Depending on the processing details and integration schemes, the hardmask may use a different material from that for the spacers 112 for reasons such that the hardmask need to remain intact while forming/etching the spacer layer and vice versa.

Figure 4:
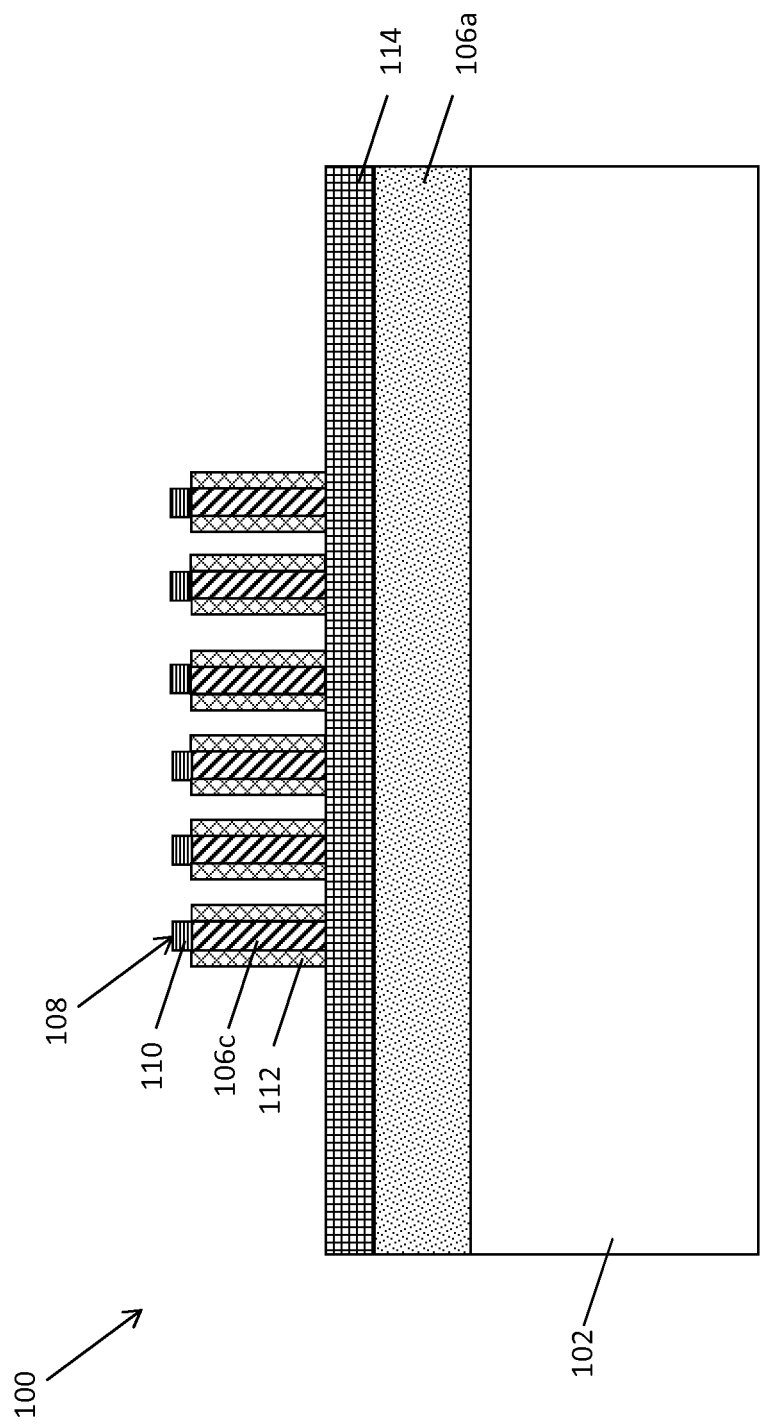

Turning now to FIG. 4, an oxidation process is applied to the wafer 100. Various chemical oxidation chemistries can be used including, for example, a wet oxidation process that exposes the intermediate III-V layer 106b to oxygen, for example, thereby forming an oxidized III-V layer 114. According to a non-limiting embodiment, the oxidized III-V layer 114 is formed having a thickness (i.e., vertical height) ranging, for example, from approximately 1 nm to approximately 50 nm. In the case where the intermediate layer 106b is formed of InAlAs, the oxidation process converts the intermediate layer 106b into an oxidized III-V layer 114 comprising indium aluminum oxide (InAlO). The plurality of fins 108 are therefore formed on the oxidized III-V layer 114. In this manner, the oxidized III-V layer 114 isolates the plurality of fins 108 from the III-V buffer layer 106a and the bulk layer 102. The oxidized III-V layer 114 further serves to prevent current leakage therethrough. Accordingly, the oxidized III-V layer 114 can serve to prevent any current flowing through the III-V channel portions 106c from leaking into the bulk layer 102. The oxidation of InAlAs occurs via a well-known chemical substitutional process whereby oxygen is substituted for a Group V element within the semiconductor material. For example, As is substituted for O through the chemical reaction of $In_{(1-y)}Al_yAs \rightarrow In_{(1-y)}Al_yO$ to convert the intermediate layer 106b is formed of InAlAs into an oxidized III-V layer 114 comprising indium aluminum oxide (InAlO).

Figure 5:
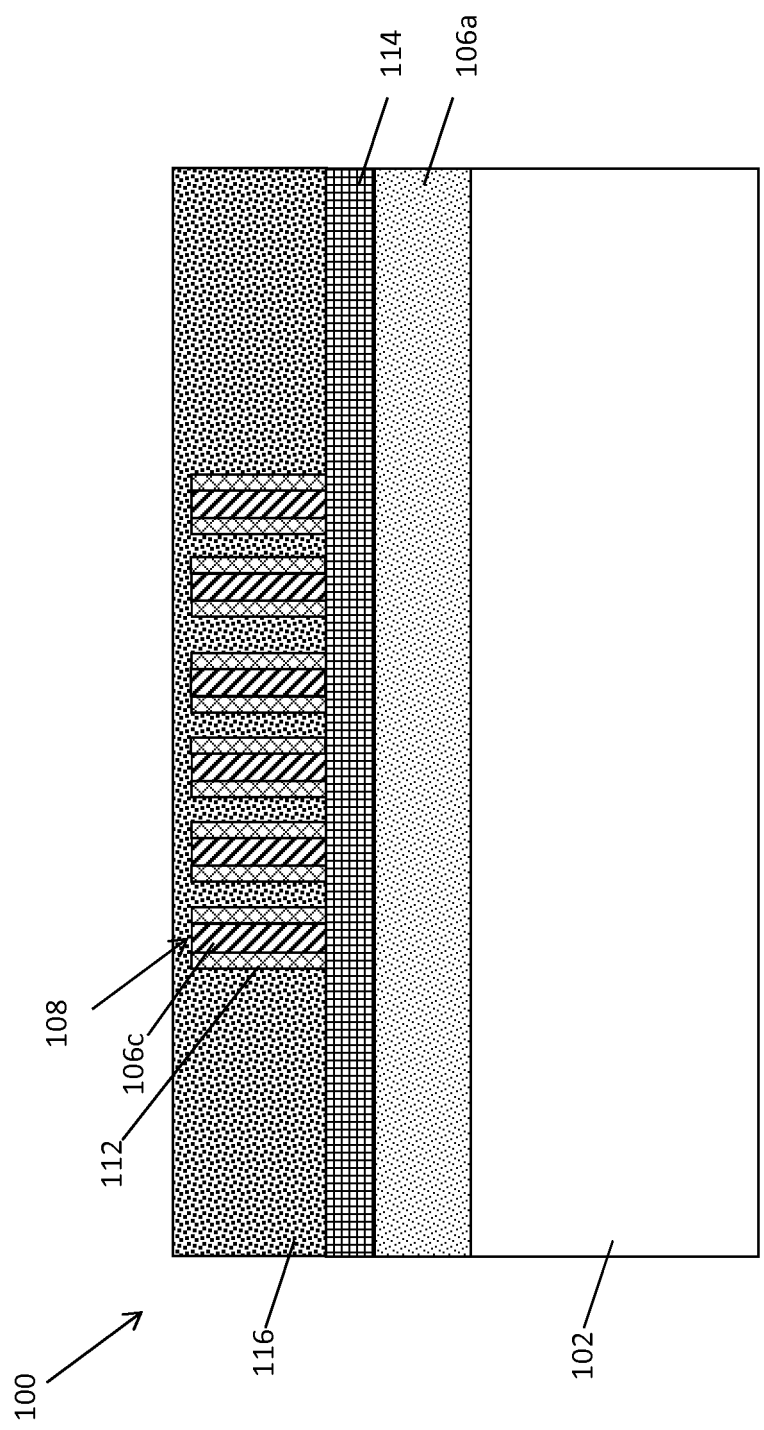
Figure 6:
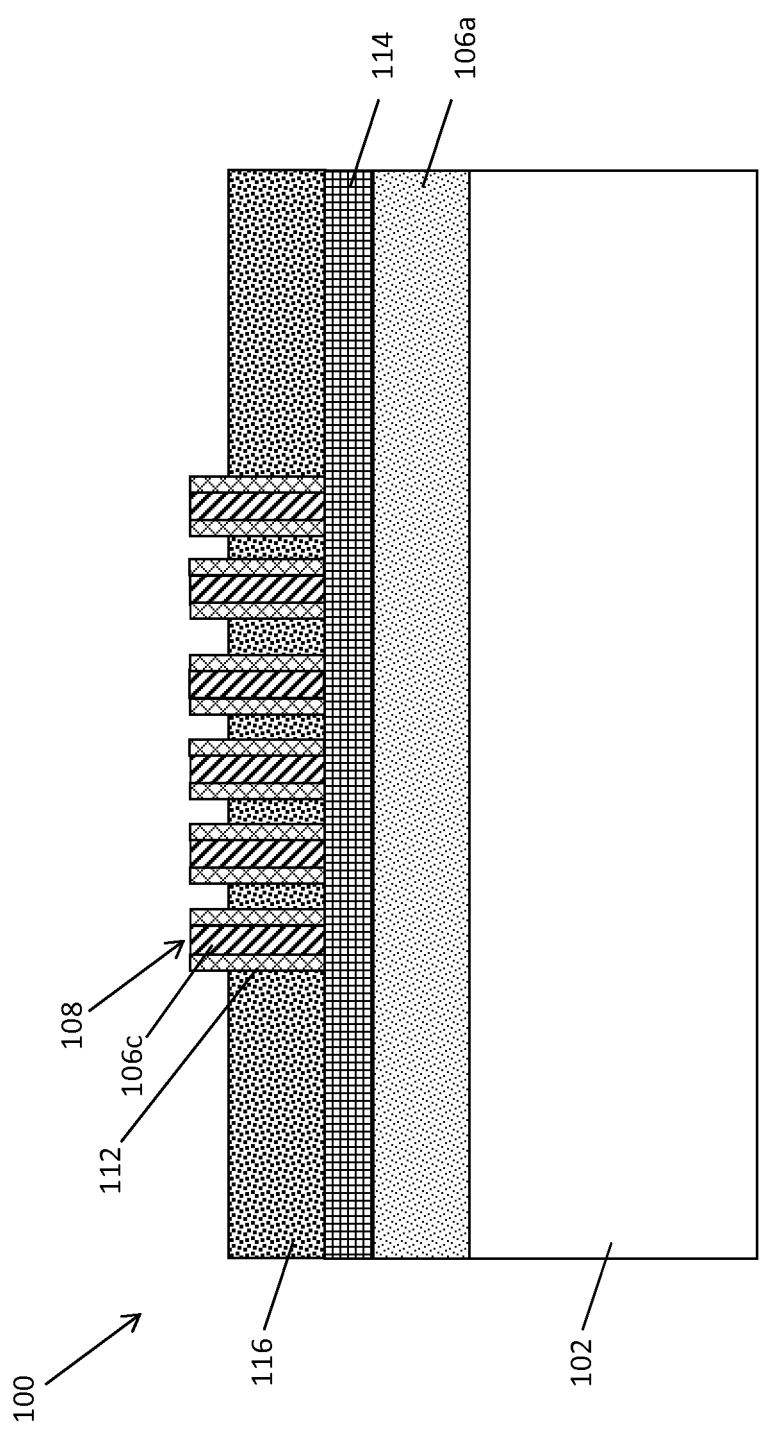

Following the oxidation process, a local fin isolation process may be performed to isolate each fin 108 from one another. Referring for example to FIG. 5, a block dielectric layer 116 is deposited on an upper surface of the oxidized III-V layer 114 to cover the fins 108 and the fin hardmasks 110. The block dielectric layer 116 may be formed of various low-k dielectric materials including, for example, silicon dioxide ($SiO_2$). A selective etching process is subsequently performed to recess a portion of the dielectric layer 116 and remove the fin hardmasks 110. Accordingly, a portion of the spacers 112 and an upper surface of the III-V channel portion 106c are exposed as shown in FIG. 6. The etching process may include a reactive ion etch (RIE) process, for example, that is selective to the spacer material (e.g., SiN) and the III-V channel material (e.g., InGaAs). The selective RIE process may also be performed according to a time etch to recess the dielectric layer 116 to a desired depth.

Figure 7:
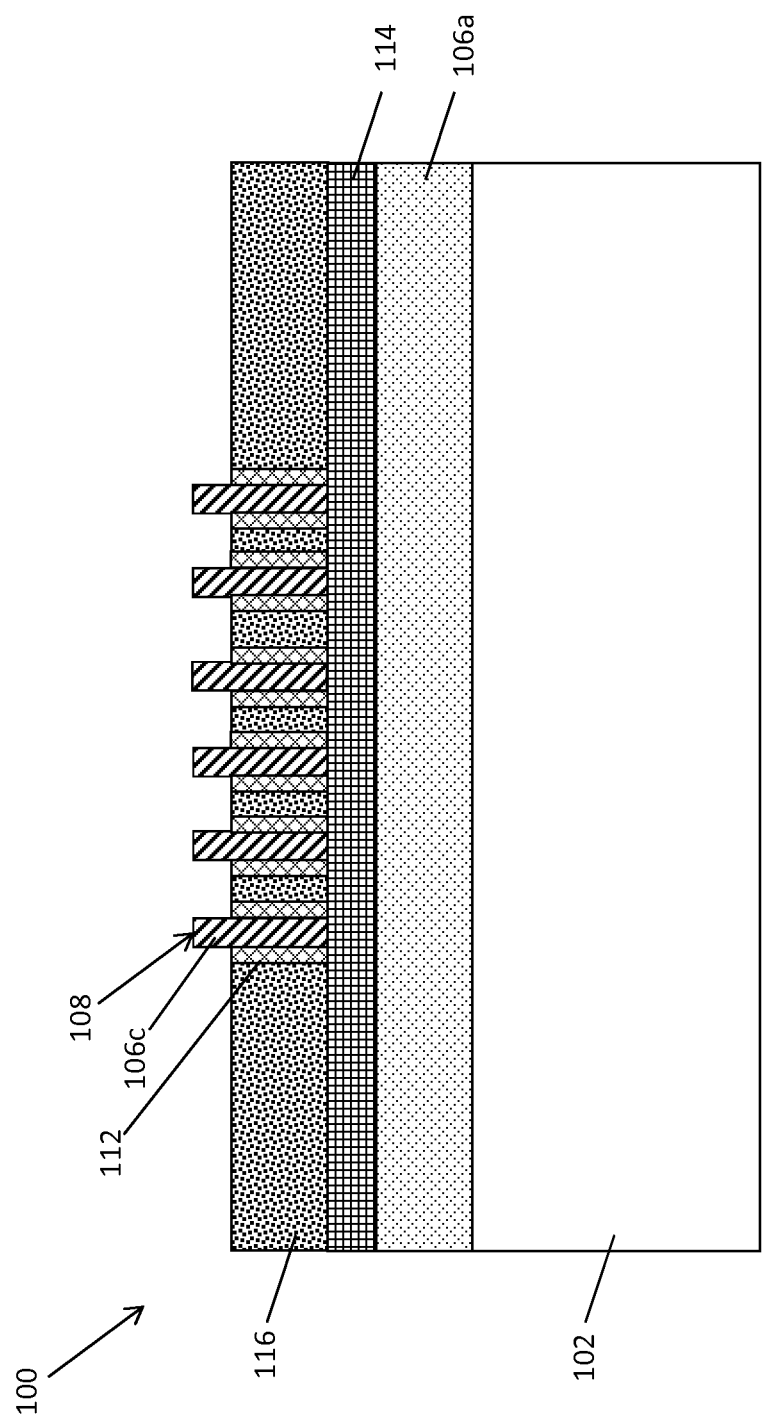

Turning to FIG. 7, a second selective etching process is performed to pull down the fin spacers 112 and expose an upper portion of the III-V channel portion 106c. In this manner, a gate stack (not shown) can be formed to wrap around the upper portion of the III-V channel portion 106c as understood by one of ordinary skill in the art. The second etching process may include a RIE process that is selective to the III-V channel portion material (e.g., InGaAs). In this manner, the recessed dielectric layer 116 can serve as an etch stop layer, thereby allowing the upper surface of the fin spacers to be flush with an upper surface of the dielectric layer 116 following the RIE process as further illustrated in FIG. 7.

Figure 8:
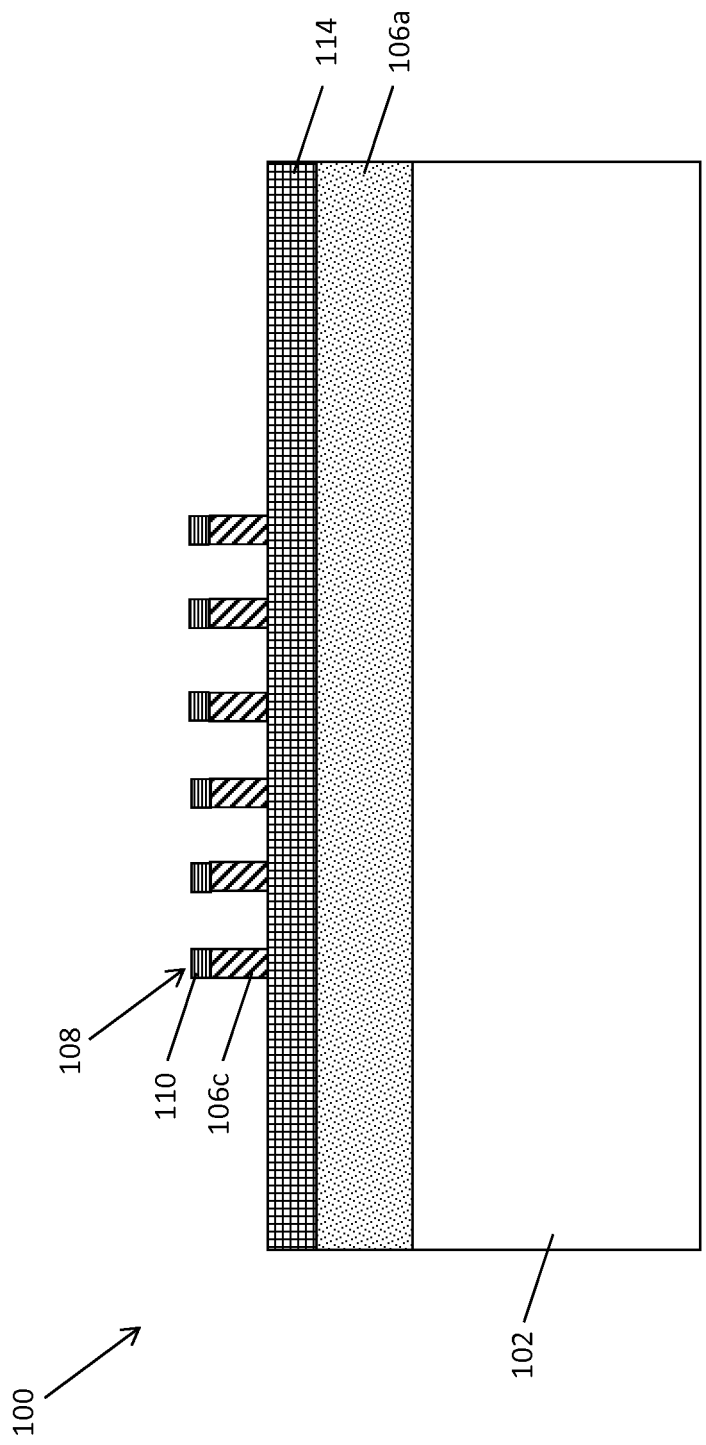

As previously mentioned above, the fin spacer formation process described with respect to FIG. 3 is optional. Accordingly the intermediate III-V layer 106b may be converted into the oxidized III-V layer 114 as discussed in detail above, but without first requiring formation of fin spacers on sidewalls of the III-V channel portion 106c. In this manner, the fins 108 (excluding fin spacers) are formed on the upper surface of the oxidized III-V layer 114 as illustrated in FIG. 8. Following the oxidation process, the block dielectric layer 116 can be deposited on the oxidized III-V layer 114 and partially etched to expose an upper portion of the III-V channel portion as described in detail above. Further, a gate stack (not shown) can be formed to wrap around the exposed III-V channel portions as understood by one of ordinary skill in the art.

Figure 9:
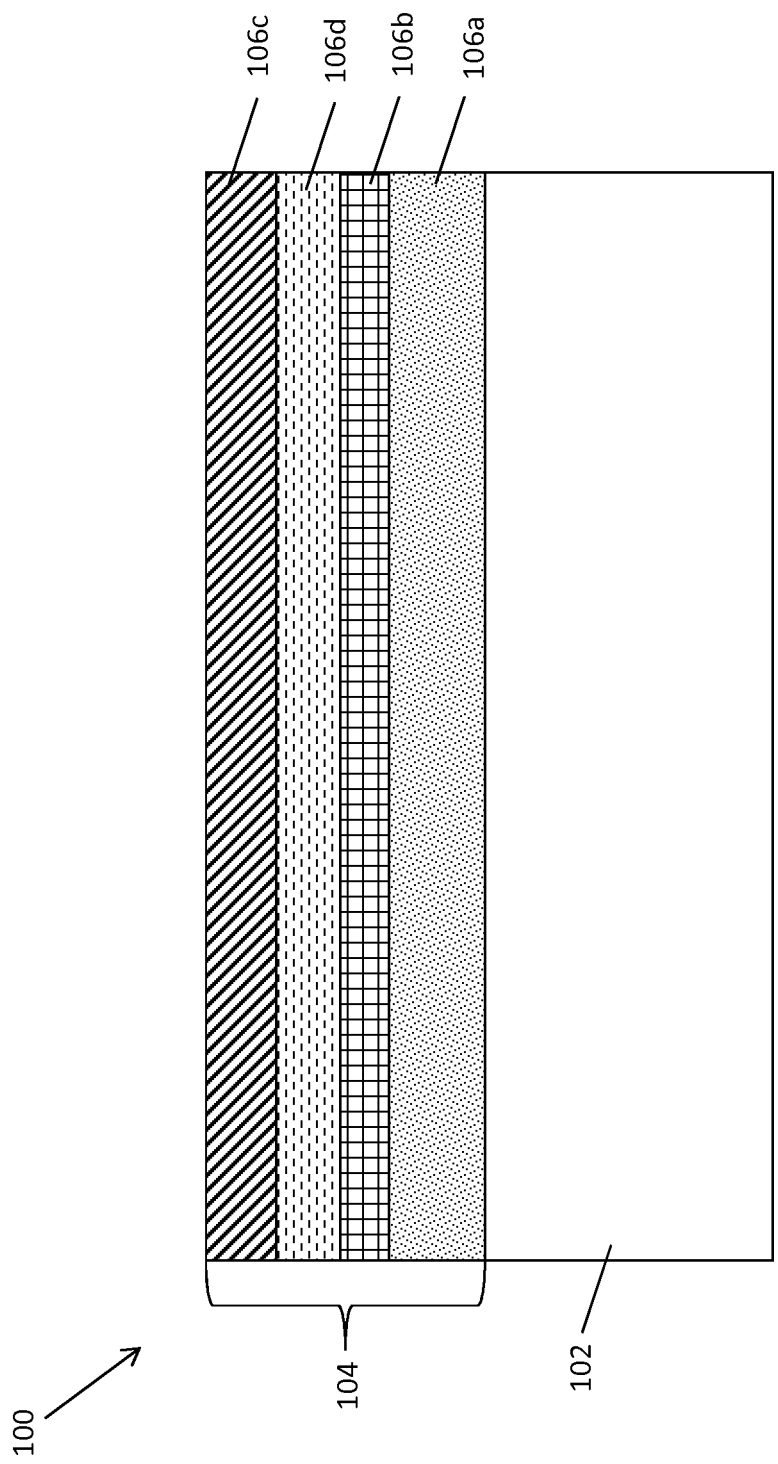

With reference now to FIGS. 9-14, a series of diagrams illustrate a process flow of fabricating a semiconductor device including an oxidized III-V fin isolator according to another non-limiting embodiment. Turning to FIG. 9, a starting wafer 100 includes a bulk layer 102 and a III-V semiconductor stack 104 formed on an upper surface of the bulk layer 102. The III-V semiconductor stack 104 includes a plurality of III-V layers 106a-106d. The plurality of III-V layers 106a-106d include a III-V buffer layer 106a formed on an upper surface of the bulk layer 102, an intermediate III-V layer 106b formed on an upper surface of the III-V buffer layer 106a, an III-V interface layer 106d formed on an upper surface of the intermediate III-V layer 106b, and a III-V channel layer 106c formed on an upper surface of the III-V interface layer 106d. In this manner, the intermediate III-V layer 106b is interposed between the III-V interface layer 106d and the III-V buffer layer 106a, and the III-V interface layer 106d is interposed between the intermediate III-V layer 106b and the III-V channel layer 106c. An epitaxial growth process may be performed to form each III-V layer 106a-106d as understood by one of ordinary skill in the art. Although the stack 104 is illustrated as including four III-V layers 106a-106d, it should be appreciated that the number of III-V layers is not limited thereto.

According to a non-limiting embodiment, each III-V layer 106a-106d is formed from a different III-V material. For example, the III-V channel layer 106c is formed of indium gallium arsenide (InGaAs). The III-V channel layer 106c may contain an amount of indium (In) ranging, for example, from approximately 20% to approximately 80%, preferably approximately 53%, for example. The III-V interface layer may be formed from indium phosphide (InP), for example. The intermediate III-V layer 106b may be formed, for example, of indium aluminum arsenide (InAlAs) with a thickness ranging from approximately 5 nm to approximately 200 nm, preferably approximately 50 nm. The III-V buffer layer 106a may also be formed of InGaAs, but with a different amount of indium (In). For example, the III-V buffer layer 106a may contain an amount of indium (In) ranging, for example, from approximately 0% to approximately 53%, for example, while the III-V channel layer 106c contains approximately 20% to approximately 80%, preferably approximately 53%, of indium (In), for example.

Figure 10:
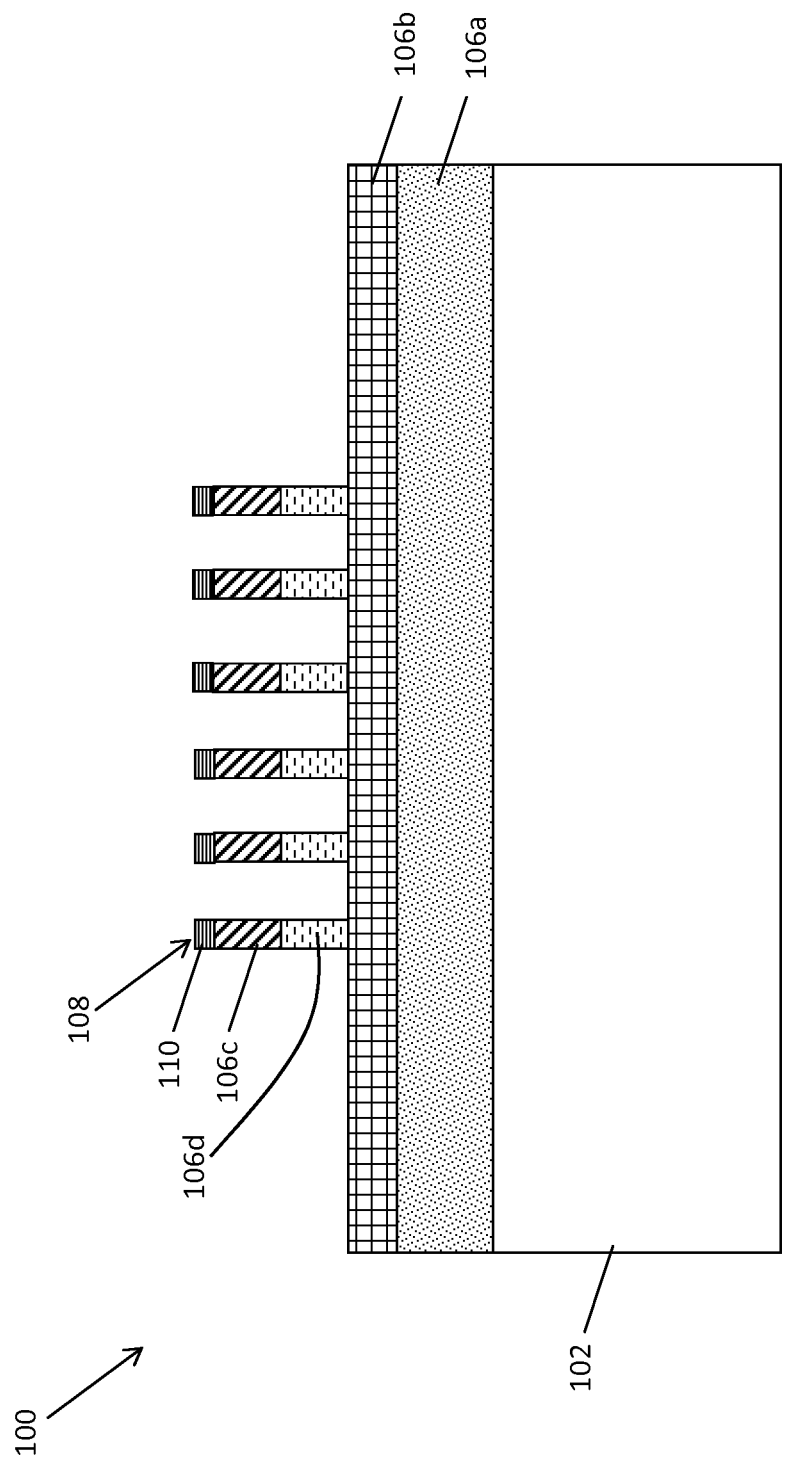

Referring to FIG. 10, the III-V channel layer 106c is patterned to form one or more semiconductor fins 108 on the upper surface of the intermediate III-V layer 106b. The fins 108 can be formed according to a well-known side image transfer (SIT) process, which utilizes a block hardmask layer (not shown) formed on an upper surface of the III-V channel layer 106c. The block hardmask layer is then patterned to designate the desired locations of the fins 108, and the pattern is transferred into the III-V channel layer 106c and the III-V interface layer 106d. The result is one or more semiconductor fins 108 formed on the intermediate III-V layer 106b. Unlike the first embodiment illustrated in FIGS. 1-8, however, the second embodiment differs from the first embodiment described above in that each fin 108 includes a III-V interface portion 106d interposed between the III-V channel portion 106c and the III-V buffer layer 106a. In this manner, the III-V interface portion 106d is formed having a wider bandgap than both the III-V channel portion 106c and the III-V buffer layer 106a. In addition, the junctions formed therewith have larger barriers for electron transport from layer 106d to layer 106a and layer 106c and may serve to prevent any current flowing through the III-V channel portions 106c from leaking into the bulk layer 102.

The fins 108 may further include a hardmask 110 that is left remaining following the fin patterning process as further illustrated in FIG. 2. According to a non-limiting embodiment, the fins 108 have a width ranging from approximately 1 nm to approximately 50 nm, for example, and a height ranging from approximately 5 nm to approximately 50 nm, for example.

Figure 11:
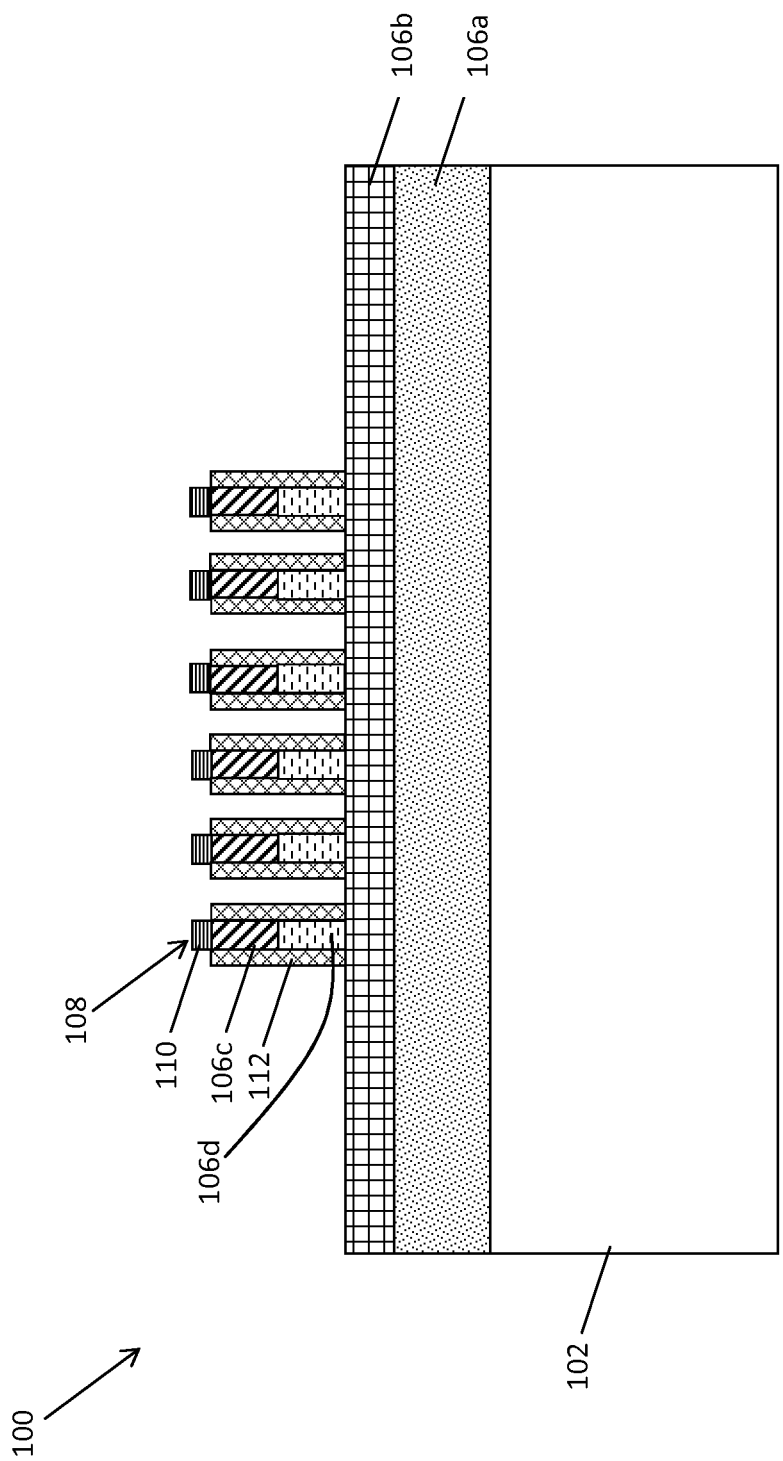

Referring now to FIG. 11, fin spacers 112 may optionally be formed on opposing sidewalls of the semiconductor fins 108. Various well-known etching processes may be used to form the fin spacers 112 on the III-V channel portion 106c on the fins 108. For example, a block nitride layer (not shown) may be deposited on an upper surface of the intermediate III-V layer 106b to cover the fins 108. Thereafter, a reactive ion etch (RIE) process selective to silicon dioxide ($SiO_2$) and III-V material can be performed to form the fin spacers 112 on the sidewalls of the III-V channel portions 106c and III-V interface portions 106c of the fins 108.

Figure 12:
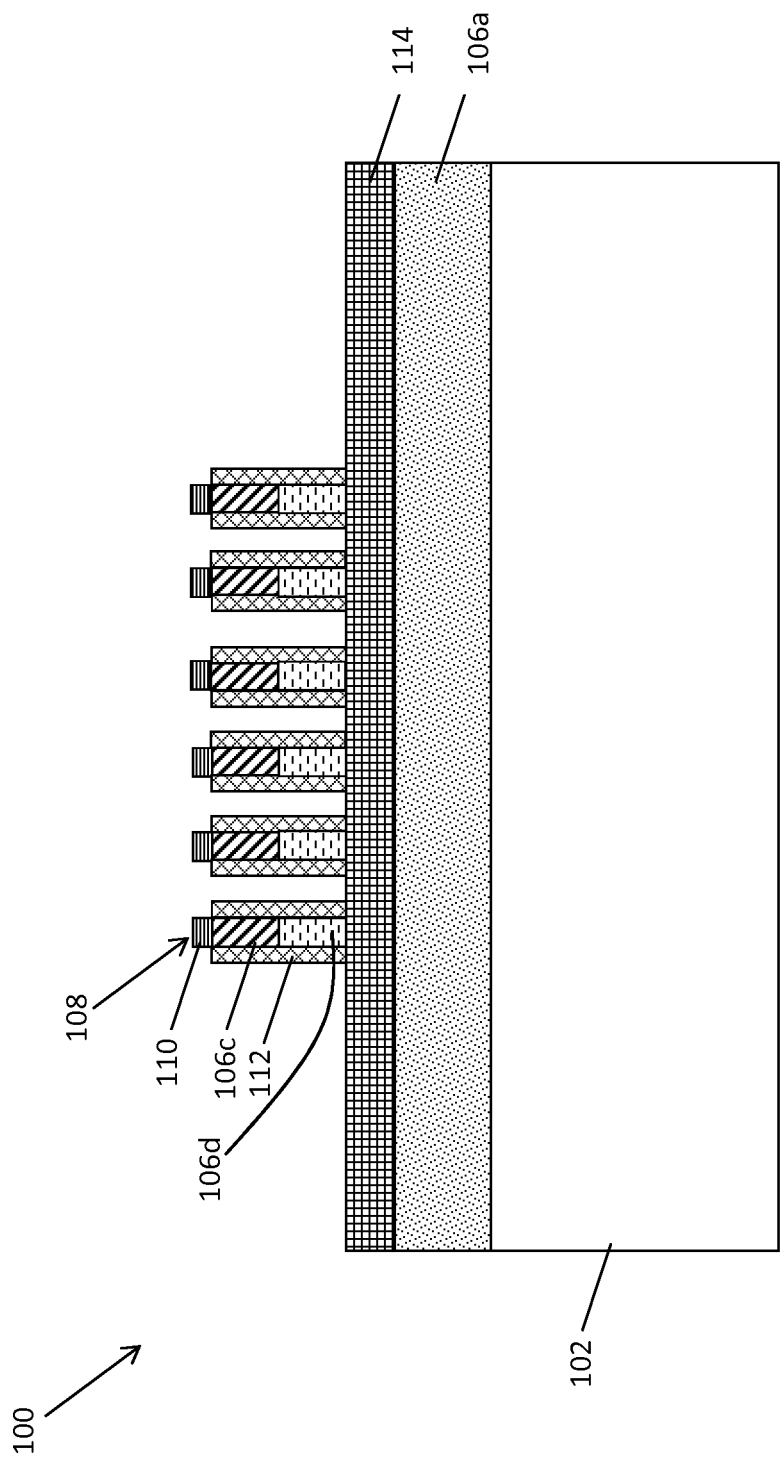

Turning now to FIG. 12, an oxidation process is applied to the wafer 100. The oxidation process performed is similar to the oxidation process described in detail above with respect to FIG. 4. Various chemical oxidation chemistries can be used such as a wet oxidation process, for example, that exposes the intermediate III-V layer 106b to oxygen, for example, thereby forming an oxidized III-V layer 114. According to a non-limiting embodiment, the oxidized III-V layer 114 is formed with a thickness (i.e., vertical height) ranging, for example, from approximately 1 nm to approximately 50 nm. In the case where the intermediate layer 106b is formed of InAlAs, the oxidation process converts the intermediate layer 106b into an oxidized III-V layer 114 comprising indium aluminum oxide (InAlO). Unlike the embodiment described with respect to FIGS. 1-8, the III-V interface portion 106d of the fins 108 is formed directly on the oxidized III-V layer 114. In this manner, III-V channel portion 106c is further isolated from the III-V buffer layer and bulk substrate layer 102. As discussed above, the oxidized III-V layer 114 further serves to prevent current leakage therethrough. Accordingly, the oxidized III-V layer 114 can serve to prevent any current flowing through the III-V channel portions 106c from leaking into the bulk layer 102.

Figure 13:
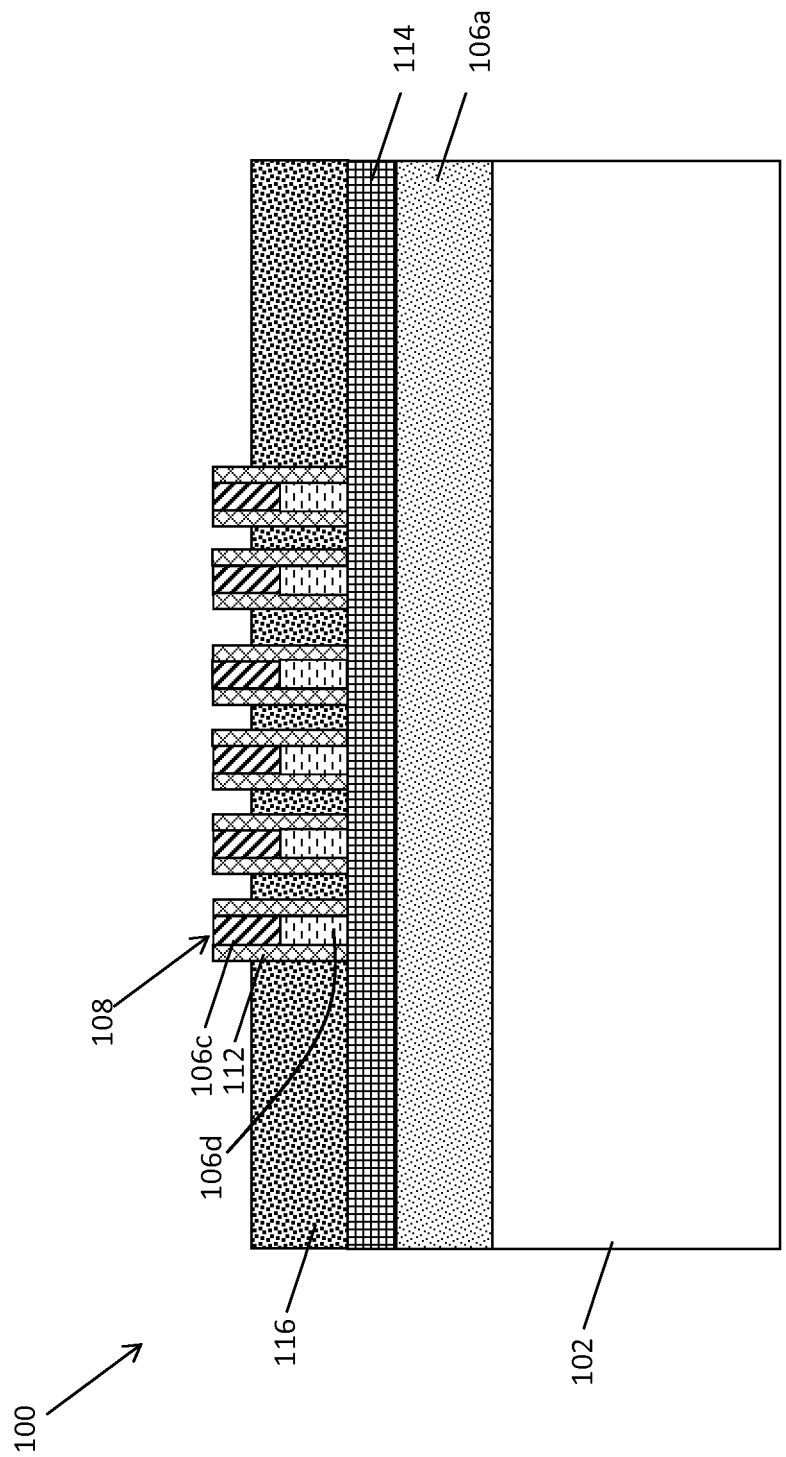

Following the oxidation process, a local fin isolation process may be performed to isolate each fin 108 from one another. Referring for example to FIG. 13, a block dielectric layer 116 is deposited on an upper surface of the oxidized III-V layer 114 to cover the fins 108 and the fin hardmasks 110. The block dielectric layer 116 may be formed of various low-k dielectric materials including, for example, silicon dioxide ($SiO_2$). A selective etching process is subsequently performed to recess a portion of the dielectric layer 116 and remove the fin hardmasks 110. Accordingly, a portion of the spacers 112 and an upper surface of the III-V channel portion 106c are exposed as further illustrated in FIG. 13. The etching process may include a reactive ion etch (RIE) process, for example, that is selective to the spacer material (e.g., SiN) and the III-V channel material (e.g., InGaAs). The selective RIE process may also be performed according to a time etch to recess the dielectric layer 116 to a desired depth.

Figure 14:
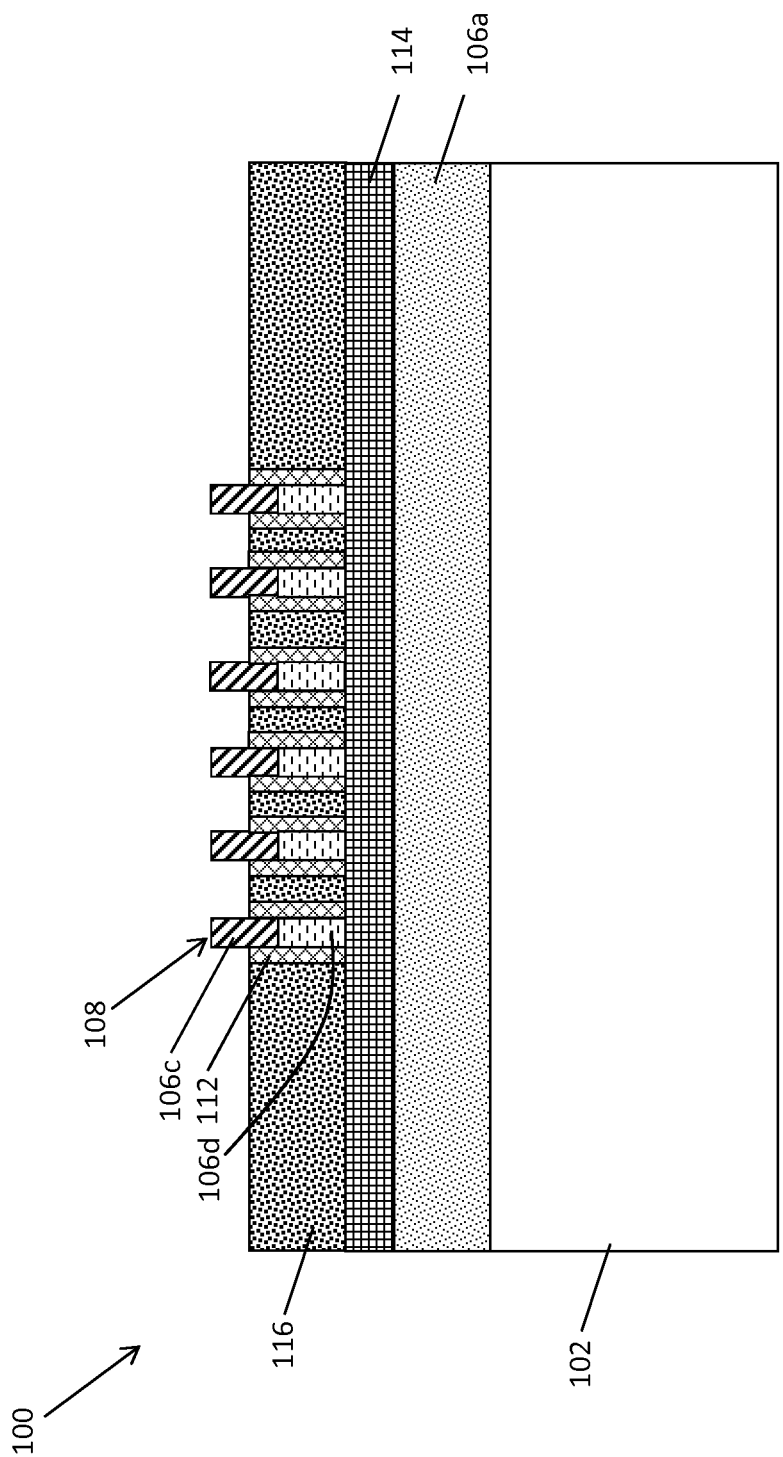

Turning to FIG. 14, a second selective etching process is performed to pull down the fin spacers 112 and expose an upper portion of the III-V channel portion 106c. In this manner, a gate stack (not shown) can be formed to wrap around the upper portion of the III-V channel portion 106c as understood by one of ordinary skill in the art. The second etching process may include a RIE process that is selective to the III-V channel portion material (e.g., InGaAs). In this manner, the recessed dielectric layer 116 can serve as an etch stop layer, thereby allowing the upper surface of the fin spacers to be flush with an upper surface of the dielectric layer 116 following the RIE process as further illustrated in FIG. 14.

Figure 15:
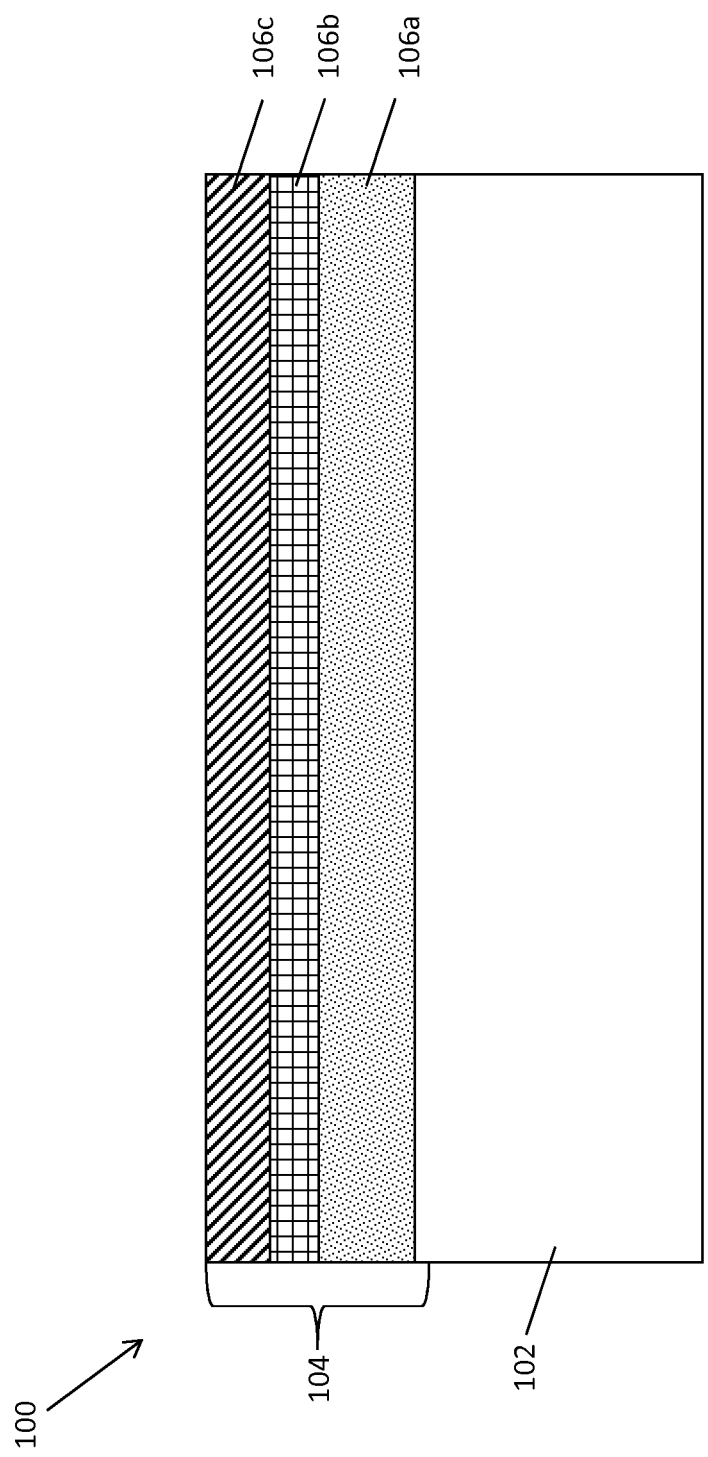

With reference now to FIGS. 15-19, a series of diagrams illustrate a process flow of fabricating a semiconductor device including an oxidized III-V fin isolator according to yet another non-limiting embodiment. Turning to FIG. 15, a starting wafer 100 includes a bulk layer 102, and a III-V semiconductor stack 104 formed on an upper surface of the bulk layer 102. The III-V semiconductor stack 104 includes a plurality of III-V layers 106a-106c. The plurality of III-V layers 106a-106c include a III-V buffer layer 106a formed on an upper surface of the bulk layer 102, an intermediate III-V layer 106b formed on an upper surface of the III-V buffer layer 106a, and a III-V channel layer 106C formed on an upper surface of the intermediate III-V layer 106b. In this manner, the intermediate III-V layer 106b is interposed between the III-V channel layer 106c and the III-V buffer layer 106a. An epitaxial growth process may be performed to form each III-V layer 106a-106c as understood by one of ordinary skill in the art. Although the stack 104 is illustrated as including three III-V layers 106a-106c, it should be appreciated that the number of III-V layers is not limited thereto.

According to a non-limiting embodiment, each III-V layer 106a-106c is formed from a different III-V material. For example, the III-V channel layer 106c is formed of indium gallium arsenide (InGaAs). The III-V channel layer 106c may contain an amount of indium (In) ranging, for example, from approximately 20% to approximately 80%. The intermediate III-V layer 106b may be formed of indium aluminum arsenide (InAlAs), for example. The III-V buffer layer 106a may also be formed of InGaAs, but with a different amount of indium (In). According to a non-limiting embodiment, the III-V buffer layer 106a may contain an amount of indium (In) ranging from approximately 0% to approximately 53%, for example, while the III-V channel layer 106c contains approximately 20% to approximately 80%, preferably approximately 53%, for example, of indium (In).

Figure 16:
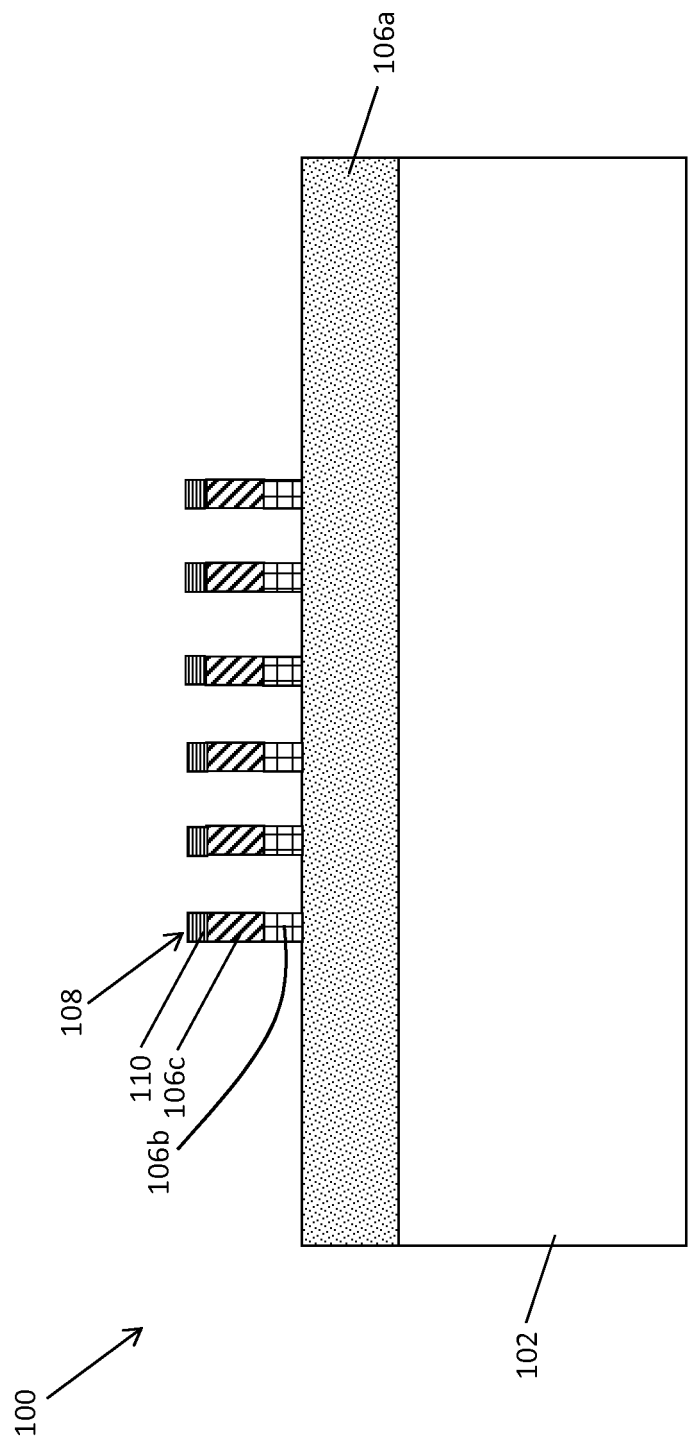

Referring to FIG. 16, the III-V channel layer 106c is patterned to form one or more semiconductor fins 108 on the upper surface of the III-V buffer layer 106a. The fins 108 can be formed according to a well-known side image transfer (SIT) process, which utilizes a block hardmask layer (not shown) formed on an upper surface of the III-V channel layer 106c. The block hardmask layer is then patterned to designate the desired locations of the fins 108, and the pattern is transferred into both the III-V channel layer 106c and the intermediate layer 106b. Unlike the first embodiment (FIGS. 1-8) and second embodiment (FIGS. 9-14) discussed above, the third embodiment differs in that each fin 108 includes a local intermediate III-V portion 106b on the III-V buffer layer 106a. Each local intermediate III-V portion 106b has a height (i.e., vertical thickness) ranging, for example, from approximately 5 nm to approximately 200 nm, preferably approximately 50 nm, for example.

The fins 108 may further include a hardmask 110 that is left remaining following the fin patterning process as further illustrated in FIG. 2. According to a non-limiting embodiment, the fins 108 have a width ranging, for example, from approximately 1 nm to approximately 50 nm, and a height ranging for example, from approximately 5 nm to approximately 50 nm. The SIT process used to form the fins 108 can included a selective etching process. For example, a RIE process selective to the hardmask material (e.g., SiN), the III-V channel material (e.g., InGaAs), and the intermediate III-V material (e.g., InAlAs). In this manner, the III-V buffer layer 106a is used as an etch stop layer allowing the formation of the fins 108 on the III-V buffer layer 106a.

Figure 17:
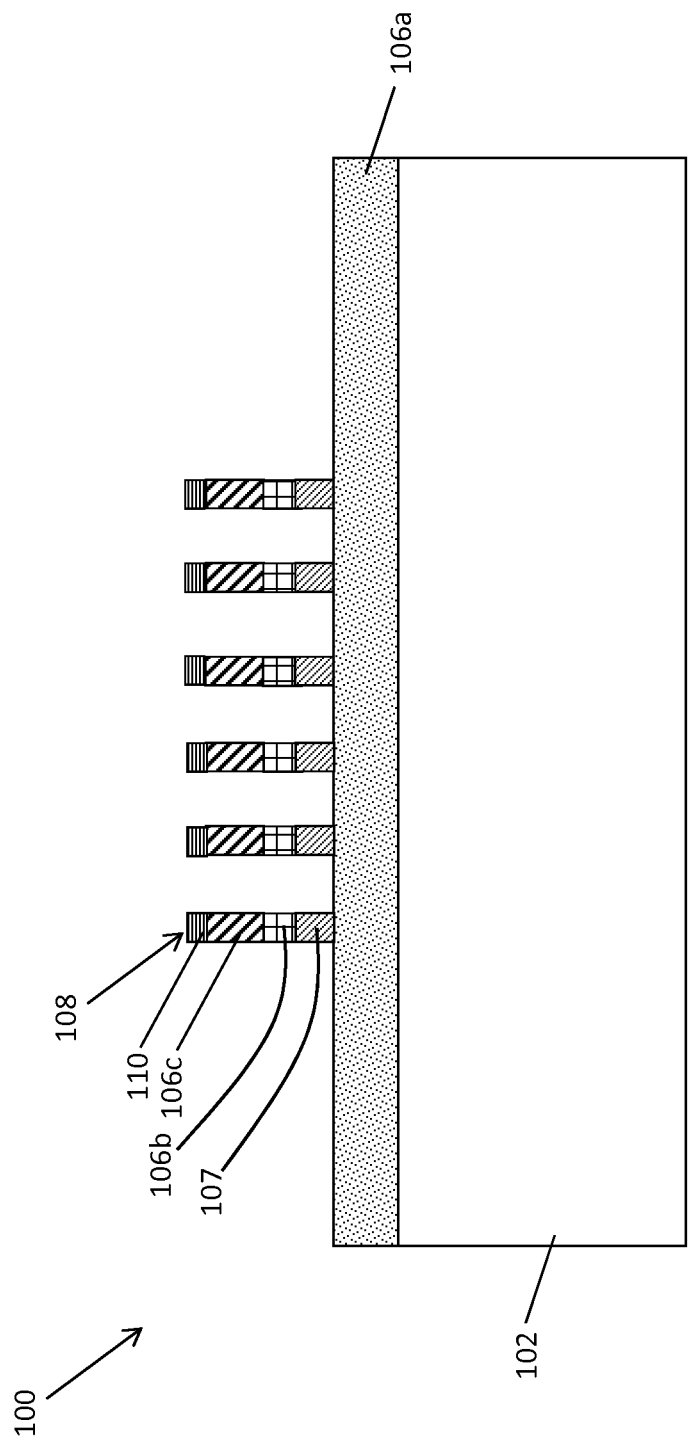

Turing to FIG. 17, the wafer 100 is illustrated following a second etching process. The second etching process punches through the III-V buffer layer 106a while the fin hardmasks 110 preserve the fins 108. In this manner, III-V buffer portions 107 are interposed between the local intermediate III-V portions 106b and the recessed III-V buffer layer 106a. The III-V buffer portions 107 have a lateral width (e.g., horizontal thickness) that does not exceed the width of the local intermediate III-V layers 106b. The second etching process may include a timed RIE process that is applied to the III-V buffer layer 106a. The time at which to apply the etching process can be chosen to etch the III-V buffer layer 106a to a particular depth in order to achieve a desired height (i.e., vertical thickness) of the intermediate III-V portions 107.

Figure 18:
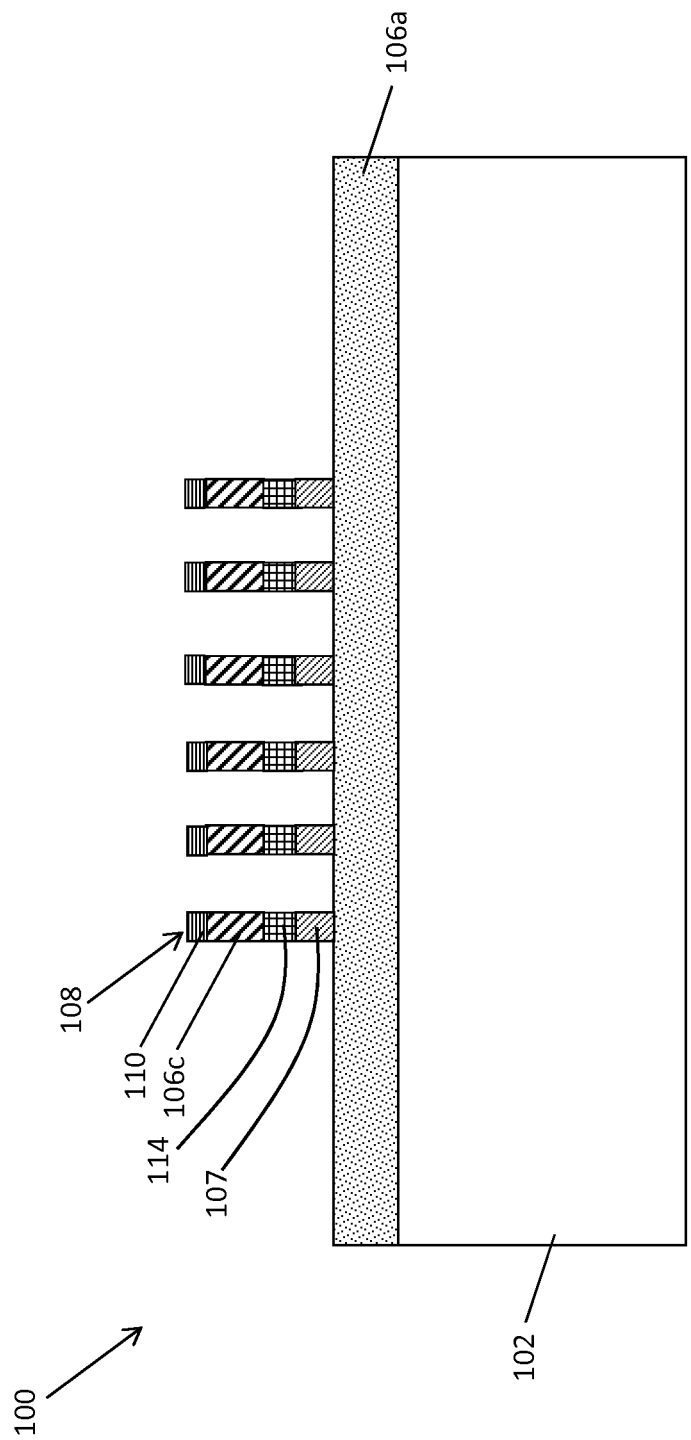

Turning now to FIG. 18, an oxidation process is applied to the wafer 100. The oxidation process in this embodiment is similar to the oxidation process described in detail above with respect to FIGS. 4 and 12. Namely, various chemical oxidation chemistries can be used including, for example, a wet oxidation process that exposes the intermediate III-V layer 106b to oxygen, for example. In this case, however, each fin 108 is formed with a local oxidized III-V portion 114, as opposed to each fin 108 being formed directly on a single oxidized III-V layer 114 that is common to all the fins 108.

According to a non-limiting embodiment, the oxidized III-V layer 114 is formed with a thickness (i.e., vertical height) ranging for example, from approximately 1 nm to approximately 50 nm. In the case where the intermediate layer 106b is formed of InAlAs, the oxidation process converts the intermediate portions 106b into an oxidized III-V portions 114 comprising indium aluminum oxide (InAlO). In this manner, the III-V channel portion 106c is isolated from the III-V buffer layer 106a and bulk substrate layer 102. As discussed above, the oxidized III-V portions 114 further serve to prevent current leakage therethrough. Accordingly, the oxidized III-V portions 114 can serve to prevent any current flowing through the III-V channel portions 106c from leaking into the bulk layer 102.

Figure 19:
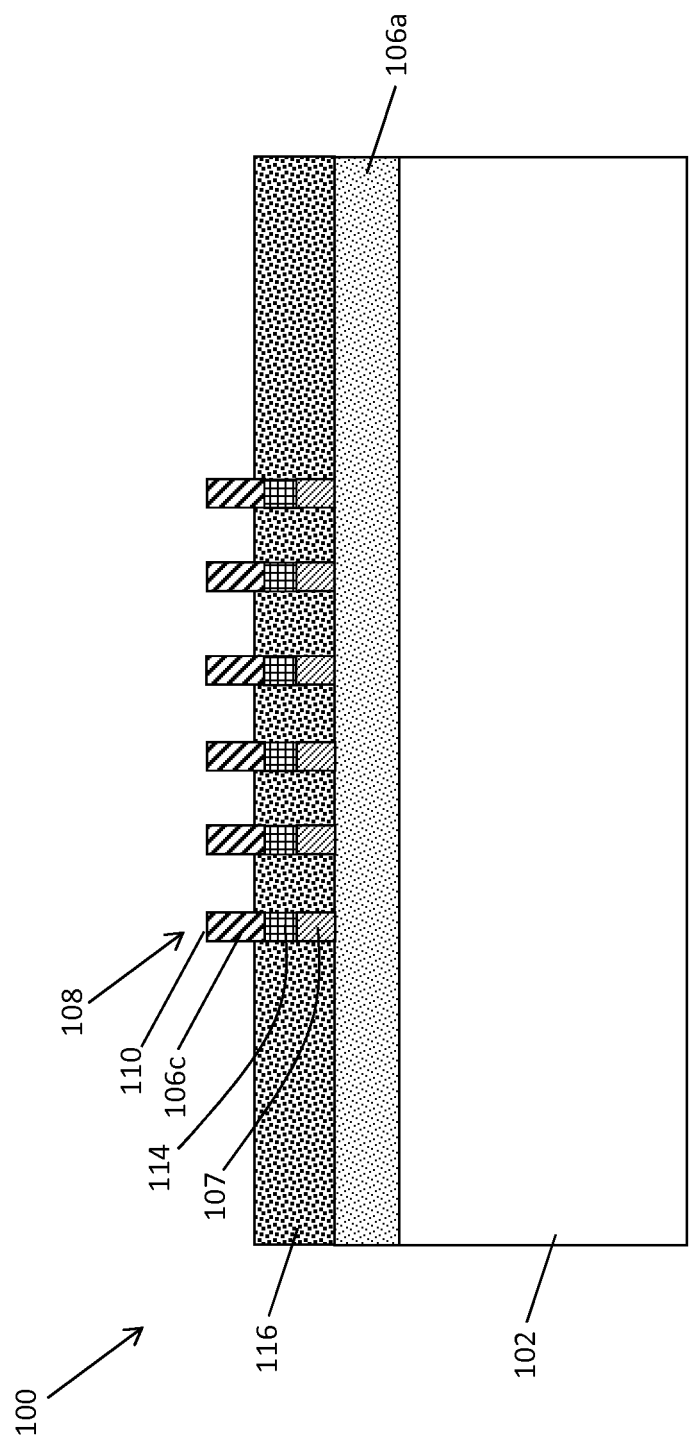

Referring to FIG. 19, a local fin isolation process may be performed to isolate each from one another following the oxidation process. As discussed above, a dielectric layer 116 can be deposited on an upper surface of the oxidized III-V layer 114 to cover the fins 108 and the fin hardmasks 110. The block dielectric layer may be formed of various low-k dielectric materials including, for example, silicon dioxide ($SiO_2$).

A selective etching process is performed to pull down dielectric layer 116 and expose an upper portion of the III-V channel portion 106c as further illustrated in FIG. 19. The etching process may include a RIE process that is selective to the III-V channel portion material (e.g., InGaAs). Accordingly, a gate stack (not shown) can be formed to wrap around the upper portion of the III-V channel portion 106c as understood by one of ordinary skill in the art. Although not illustrated in FIG. 15-19, it should be appreciated that spacers can be formed on sidewalls of the fins 108 as discussed above with respect to FIGS. 3 and 11.

Various embodiments described in detail above provide a compound FinFET device including an II-V oxidation layer, i.e., oxidized III-V fin isolator to reduce thread dislocation and prevent current leakage from the III-V channel of the fins. The III-V fin isolator may include an oxidized III-V interposed between a bulk layer of the wafer and one or more fins. According to another embodiment, the oxidized III-V fin isolator may include an oxidized III-V portion formed locally with each fin, and interposed between the III-V channel and the bulk layer of the wafer. In either case, the oxidized III-V isolator can serve to prevent current leakage therethrough. Accordingly, the oxidized III-fin isolator can prevent any current flowing through the III-V channel portions from leaking into the bulk layer, thereby providing a compound FinFET device having improved performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device comprising:
a wafer extending along a first direction to define a length, a second direction opposite the first direction to define a width, and a third direction opposite the first and second directions to define a height, the wafer including a bulk layer and a III-V buffer layer on an upper surface of the bulk layer, the III-V buffer layer comprising indium (In) and extending continuously along the entire length of the wafer; and
at least one semiconductor fin directly on an upper surface of the III-V buffer layer, the at least one semiconductor fin including a III-V channel portion comprising indium (In),
wherein one of the wafer or the at least one semiconductor fin includes an oxidized III-V portion directly on an upper surface of the III-V buffer layer such that the oxidized III-V portion is interposed between the III-V channel portion and the III-V buffer layer configured to prevent current leakage from the III-V channel portion to the bulk layer.

2. The semiconductor device of claim 1, wherein the III-V buffer layer extends approximately a full width of the wafer.

3. The semiconductor device of claim 2, wherein the wafer includes the oxidized III-V portion on the III-V buffer layer, the oxidized portion extending approximately the full width of the wafer.

4. The semiconductor device of claim 3, wherein the at least one semiconductor film includes a III-V interface portion interposed between the III-V channel portion and the oxidized III-V portion.

5. The semiconductor device of claim 1, wherein the oxidized III-V portion is a localized oxidized portion of the at least one semiconductor fin, the localized oxidized portion having a first width that does not exceed a second width of the III-V channel portion, wherein the at least one semiconductor fin includes a III-V buffer portion interposed between the localized oxidized III-V portion and the III-V buffer layer, and wherein the III-V buffer portion has a width less than the III-V buffer portion.

* * * * *